United States Patent
Nirschl et al.

(10) Patent No.: US 7,864,565 B2
(45) Date of Patent: Jan. 4, 2011

(54) DATA RETENTION MONITOR

(75) Inventors: Thomas Nirschl, Essex Junction, VT (US); Jan Otterstedt, Unterhaching (DE); Christian Peters, Vaterstetten (DE); Michael Bollu, Kirchheim (DE); Wolf Allers, Munich (DE); Michael Sommer, Raubling (DE)

(73) Assignee: Infineon Technologies AG, Neubiberg (DE)

( * ) Notice: Subject to any disclaimer, the term of this patent is extended or adjusted under 35 U.S.C. 154(b) by 451 days.

(21) Appl. No.: 11/831,448

(22) Filed: Jul. 31, 2007

(65) Prior Publication Data

US 2009/0034343 A1     Feb. 5, 2009

(51) Int. Cl.
    *G11C 11/00*     (2006.01)
(52) U.S. Cl. .................. 365/163; 365/189.07; 365/201; 365/189.06; 365/189.15; 365/189.16; 365/46; 365/100; 365/112; 365/148
(58) Field of Classification Search .................. 365/164, 365/189.07, 201, 189.06, 189.09, 189.15, 365/189.16, 46, 100, 113, 148
See application file for complete search history.

(56) References Cited

U.S. PATENT DOCUMENTS

| | | | |
|---|---|---|---|
| 6,665,216 B1 * | 12/2003 | Ho et al. | 365/189.07 |
| 6,707,737 B2 * | 3/2004 | Tanizaki | 365/201 |
| 7,042,760 B2 | 5/2006 | Hwang et al. | |
| 7,336,526 B2 * | 2/2008 | Osada et al. | 365/163 |
| 7,483,305 B2 * | 1/2009 | Yamada | 365/185.2 |
| 7,534,713 B2 * | 5/2009 | Lung | 438/600 |
| 2006/0198183 A1 * | 9/2006 | Kawahara et al. | 365/163 |
| 2006/0227591 A1 | 10/2006 | Lowrey et al. | |

OTHER PUBLICATIONS

Pirovano et al., Reliability Study of Phase-Change Nonvolatile Memories, IEEE Transactions on Device and Materials Reliability, 2004; 4(3):422-427.

* cited by examiner

*Primary Examiner*—Hoai V Ho
*Assistant Examiner*—Fernando N Hidalgo
(74) *Attorney, Agent, or Firm*—Dickstein Shapiro LLP

(57) ABSTRACT

A data retention monitor for a memory cell including a voltage source and a voltage comparator. The voltage source is adapted to provide a selectable voltage to the memory cell. The selectable voltage includes a read voltage and a test voltage, with the test voltage being greater than the read voltage. The voltage comparator is adapted to compare a voltage of the memory cell with a reference voltage after the provision of the selectable voltage to the memory cell. The memory cell retains data when the memory cell voltage generated at least in part by the test voltage is substantially equal to the reference voltage.

10 Claims, 4 Drawing Sheets

DATA RETENTION MONITOR

BACKGROUND OF THE INVENTION

This invention relates generally to semiconductor memories, and more particularly to a system and method for monitoring memory content of a memory cell.

One type of memory utilizes a phase change material that may be, in one application, electrically switched between amorphous and crystalline states, or between different detectable states across the entire spectrum between completely amorphous and completely crystalline states.

The operation of a phase change memory (PCM) is based on a resistance change caused by the different states of the phase change material. Typical materials suitable for the phase change material include, but are not limited to, various chalcogenide glasses, such as GeSbTe. The advantages of phase change memories include high write throughput and single-bit random write access.

When the memory is set in either a crystalline, semi-crystalline, amorphous, or semi-amorphous state having a respective resistance value, that state is retained until reprogrammed, even if power is removed. The state is retained because the programmed resistance represents a phase or physical state of the material (e.g., crystalline or amorphous). The state of the phase change materials is thus generally non-volatile.

A first low resistive state, i.e. crystalline state or semi-crystalline state, is achieved by a small power being applied to the memory compared to the second state, i.e. amorphous state or semi-amorphous state, where a high power pulse is used to melt and quench the material into an amorphous state. It is possible to program the cell into mid-level states by application of medium power levels.

SUMMARY OF THE INVENTION

A data retention monitor for a memory cell including a voltage source and a voltage comparator. The voltage source is adapted to provide a selectable voltage to the memory cell. The selectable voltage includes a read voltage and a test voltage, with the test voltage being greater than the read voltage. The voltage comparator is adapted to compare a voltage of the memory cell with a reference voltage after the provision of the selectable voltage to the memory cell. The memory cell retains data when the memory cell voltage generated at least in part by the test voltage is substantially equal to the reference voltage.

DESCRIPTION OF THE PREFERRED EMBODIMENTS

A. Overview

Phase change memory cells are typically read without triggering a state change of the memory cell. A concern for phase change memory is read disturb and data loss for memory cells that are in the amorphous state due to crystallization of the phase change material at elevated temperatures. Phase change occurs when the threshold current at the threshold voltage of the memory cell is exceeded. As a result, the read current may be limited to avoid triggering. However, limiting the read current to less than the threshold current reduces performance. Use of a higher current while limiting the applied voltage to be less than the threshold voltage results in the memory cell being sensitive to variations in the threshold voltage. Such an approach may reduce margin and inadvertently trigger the memory cell, possibly causing the cell to change (read disturb) or to be misread (non-repeating "soft error"). In order to reduce read disturb in PCMs, a PCM cell should be rewritten if it is in the process of shifting from the amorphous state to the crystalline state, or if it is shifting between semicrystalline states.

In a typical PCM, the resistance of each PCM cell varies based on its state, generally ranging from 100 KΩ in the crystalline state to 1 MΩ in the amorphous state. The number of discrete resistance values assigned to each PCM cell determines the number of states a given PCM cell has. As the resistance of the PCM cell varies, a voltage on a data line caused by the read voltage for the PCM cell varies. During increased ambient temperature the resistance of the PCM cell is reduced to an amorphous state, resulting in an increased current through the PCM cell; correspondingly, temperature of the phase change material increases, thereby enhancing crystallization. Therefore, using a greater read voltage accelerates read disturb. A PCM cell that is close to losing its stored information may be detected by reading data from the PCM cell with a standard voltage, measuring the data line voltage, and subsequently comparing the data line voltage at a greater read voltage. Alternatively, such a PCM cell may be detected by reading the data with a greater read voltage and comparing the voltage on the data line with a reference voltage.

B. Data Retention Monitor

Figure 1:
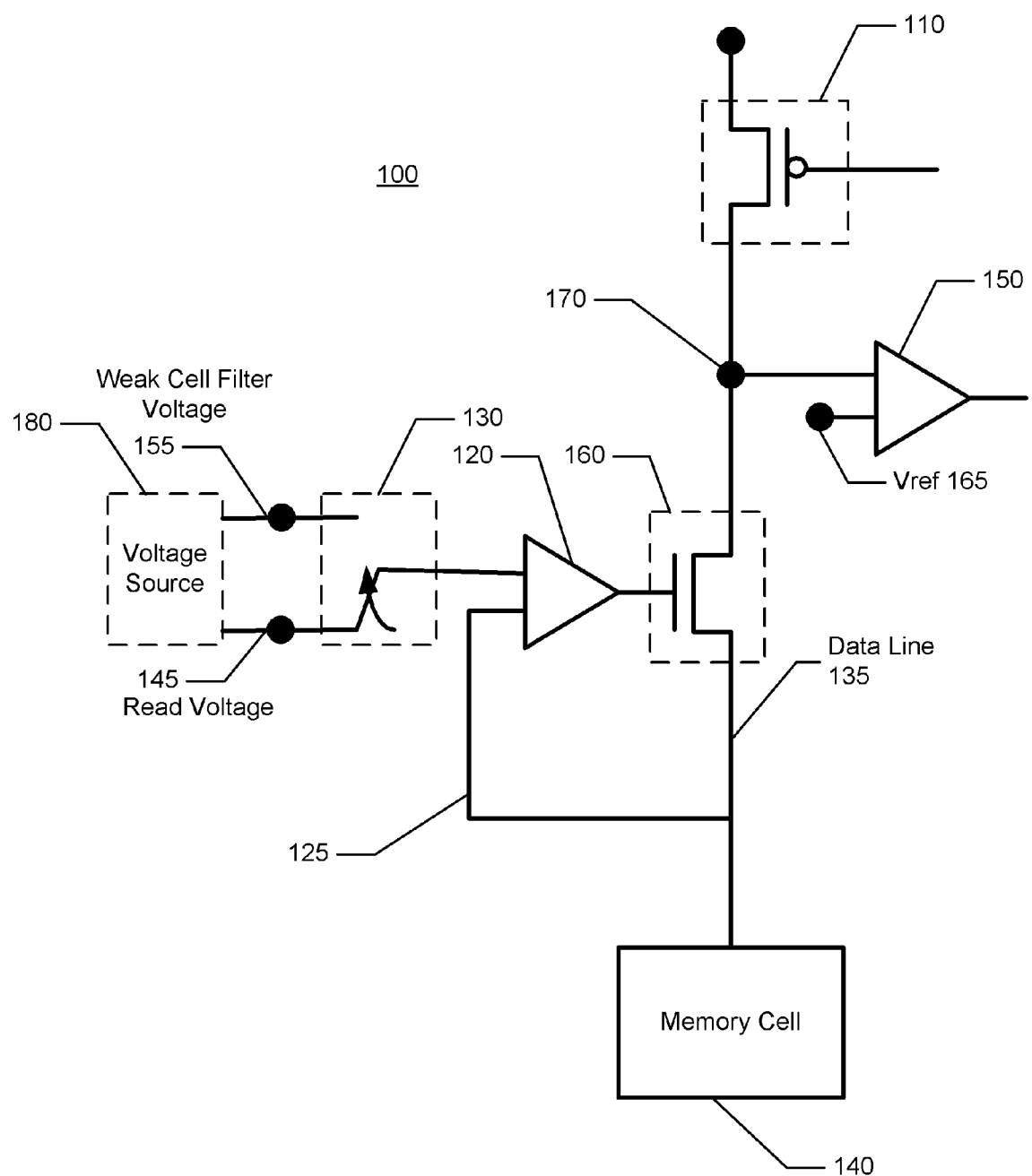
FIG. 1 is a schematic diagram of a data retention monitor in accordance with an embodiment of the invention.

FIG. 1 shows a data retention monitor 100 according to an embodiment of the invention. As shown, data retention monitor 100 includes a memory cell 140. While only a single memory cell 140 is shown, data retention monitor 100 can be applied to a memory array of any size. To read data in memory cell 140, a read voltage 145 of voltage source 180 is applied to data line 135 via switch 130, clamp 120, and switch 160. A voltage measured at node 170 represents the data stored in memory cell 140. Clamp 120 has two inputs, a first input being the read voltage, a second input being a voltage from the data line 135 via feedback 125. In an embodiment, the feedback voltage is typically 450 mV to 500 mV. As the temperature of the device increases, either due to operation or the environment, the voltage needed to read the data in memory cell 140 decreases due to the decreasing resistance of the memory cell 140.

Memory cell 140 is programmable into one of at least two memory states by applying an electrical signal to data line 135. The electrical signal alters the phase of the memory material between a substantially crystalline state and a substantially amorphous state. As noted above, the electrical resistance of the memory cell 140 in the substantially amorphous state is greater than the resistance of the memory cell in the substantially crystalline state.

B1. Write Data

To write data to memory cell 140, the phase of the memory cell 140 may be altered by the current source 110 providing a high current that results in a heating of the memory cell 140. In some applications, the high current is approximately 2 mA. The current melts at least a part of the phase change material and, when the charge is removed, the temperature drops quickly and the melted portion of the material solidifies in the amorphous state having a higher resistance.

Alternatively, data may be written to the memory cell 140 by the current source 110 applying a low current that energizes the phase change material so that the phase change material is allowed to arrange itself into a more crystalline state having a lower resistance. In some applications, the low current is approximately 1.2 mA.

It should be noted that heat alone tends to alter the state of the memory cell.

B2. Weak Cell Test

To verify the integrity of memory cell 140, data retention monitor 100 performs a weak cell test. The weak cell test determines if a lower than expected resistance is present in the memory cell 140 under test. If a lower resistance is present, a higher current will flow through the cell and the cell will fail the weak cell test. Before a weak cell test is performed, the content (state) of memory cell 140 is determined. In an embodiment, the current state of memory cell 140 is used to set the value of Vref 165.

To perform the weak cell test, switch 130 selects weak cell filter voltage 155 from voltage source 180 and applies it to data line 135 via clamp 120 and switch 160. The weak cell filter voltage 155 is higher than the read voltage 145 in order to stress the memory cell 140. A comparator 150 compares the voltage on the data line 135 at node 170 with a reference voltage Vref 165. If the voltage at node 170 is substantially equal to reference voltage Vref 165, the memory cell 140 passes the weak cell test and does not need to be rewritten. Conversely, when the voltage at node 170 is not substantially equal to reference voltage Vref 165, the memory cell 140 fails the weak cell test and needs to be rewritten in the manner described in section B1 above. It should be noted that different values of Vref are used for different memory states.

Alternatively, the weak cell test may be performed by using the voltage at node 170 during the read operation as the reference voltage Vref 165. This voltage initially read from the cell 140 is compared with the voltage at node 170 due to weak cell filter voltage 155. A rewrite is required if the two voltages differ by at least a predetermined amount.

The read, write, and verification parameters vary with environmental conditions. In an embodiment, at 85° C., a breakdown voltage of memory cell 140 is about 1V, the read voltage 145 is typically within an approximate range of 50 mV to 800 mV, and the weak cell filter voltage 155 is typically within an approximate range of 50 mV to 1V greater than read voltage 145. As the temperature of memory cell 140 increases, lower read and weak cell voltages are needed.

The weak cell test is an aggressive readout that destroys the data in memory cell 140 if the memory cell 140 is close to failing. Therefore, prior to performing a weak cell test, the data is either read from memory cell 140 or recently written into memory cell 140 so the data is known. During the weak cell test, a normal cell will retain the semiamorphous or amorphous state. If a memory cell fails the weak cell test, the state of the memory cell becomes more crystalline. In an embodiment, the weak cells are tracked so that if a memory cell has a higher than normal failure rate, that cell can be skipped in future write steps.

At higher temperatures, a memory cell 140 is more prone to failure as the higher temperatures tend to cause crystallization of the PCM material. The higher current provided to the PCM during the weak cell test mimics a high temperature operation of the PCM. This test ensures that the PCM will operate at all desired temperatures. Additionally, by tracking cells that are more prone to failure, those cells can be avoided.

C. Operational Tests

There are three operational tests for the data retention monitor 100 of FIG. 1, a write verification test, a background memory test, and a foreground memory test, as will be explained below with respect to FIGS. 2-4. In a typical application, a plurality of memory cells are arranged in a array.

C1. Write Verification Test

Figure 2:
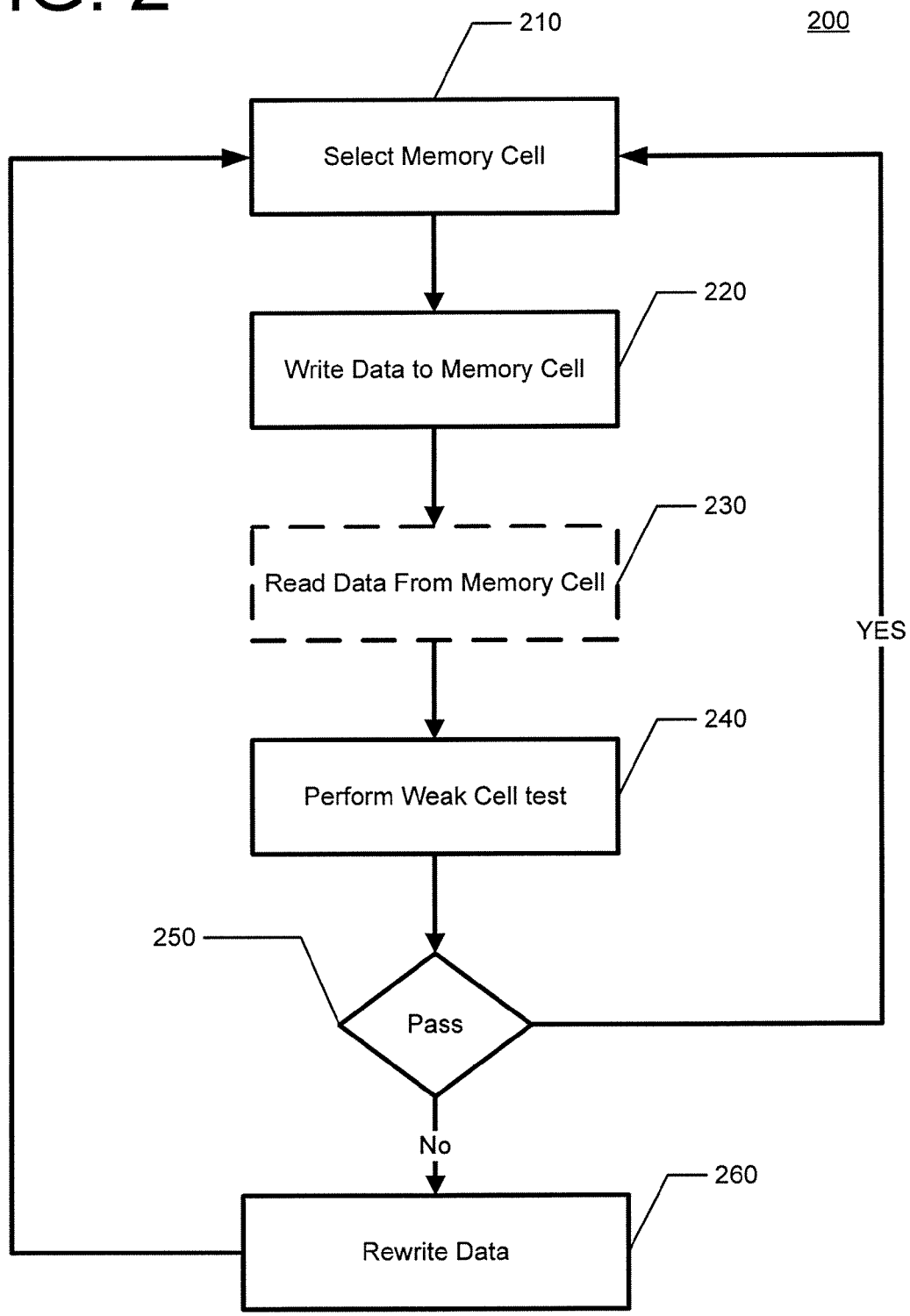
FIG. 2 is a flow chart showing a write verification test in accordance with an embodiment of the invention.

A write verification test 200 in accordance with an embodiment of the invention is shown in FIG. 2. A write verification test involves performing a weak cell test to verify the content of the memory cell after data is written to a memory cell. The data written to the memory cell is used to determine Vref.

The write verification test begins by selecting a memory cell 140, which includes a phase change material (S210). After the memory cell 140 is selected, data is written to the selected memory cell 140 (S220) by supplying a current from current source 110, as described above in section B1. After the data is written to the memory cell 140 (S220), a weak cell test is performed (S240) in the manner described above in section B2. If the memory cell 140 passes the weak cell test (S250), the process repeats with selection of the next memory cell 140 in the array (S210). If the memory cell 140 fails the weak cell test (S250), on the other hand, the data is first rewritten to the memory cell 140 (S260), as described above in section B1, and then the process repeats with selection of the next memory cell 140 in the array (S210).

Optionally, to verify that the data has been written to memory cell 140, the data can be read from memory cell 140 (S230) and saved in another location in case the data in the memory cell is destroyed during the weak cell test. To read the data, if required, a read voltage 145 is selected from voltage source 180 by switch 130 and applied to data line 135 via clamp 120 and switch 160. A voltage at node 170 is representative of the data in memory cell 140. This data can then be saved to another location. It should be noted that the step of reading data from the memory cell (S230) is not required in all embodiments because the data written into the memory (S220) is typically still available to be rewritten.

C2. Background Memory Test

Figure 3:
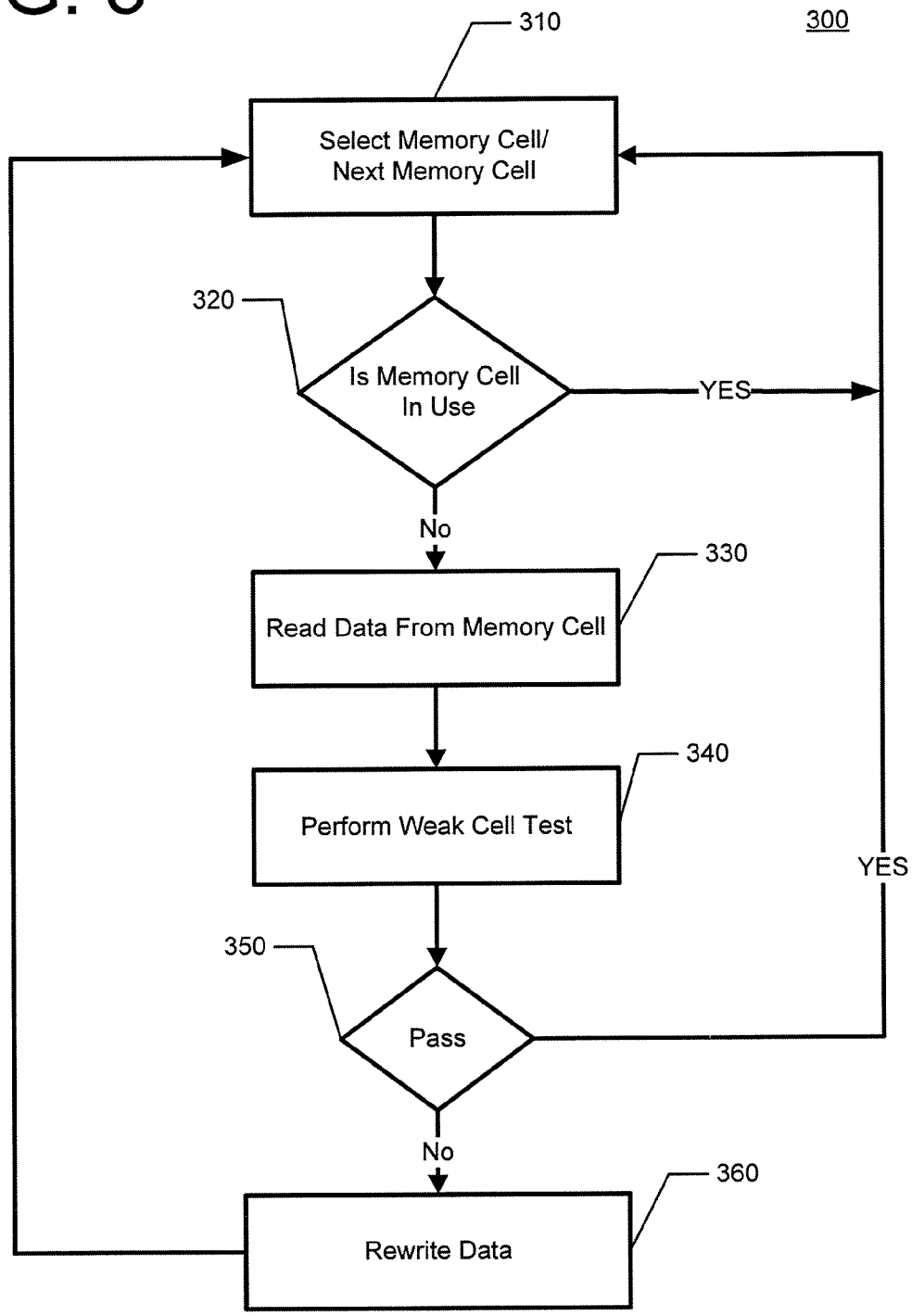
FIG. 3 is a flow chart showing a background memory test in accordance with an embodiment of the invention.

FIG. 3 is a flow chart showing a background memory cell test 300 in accordance with an embodiment of the invention. A background memory test is a test in which a maintenance check is performed in a memory array independent of read or write operations.

The background memory test 300 begins by selecting a memory cell 140, which includes a phase change material (S310). After the memory cell 140 is selected, it is determined whether the memory cell 140 is in use, i.e., being read from or written to (S320). In an embodiment, the system makes this determination by analyzing the state of switch 160; if the switch 160 is turned on, the memory cell 140 is in use, and if the switch 160 is not turned on, the memory cell 140 is not in use.

If the memory cell 140 is in use, the next memory cell 140 in the memory cell array is selected (S310) so as to not interfere with the normal operation of the memory cell 140. On the other hand, if the memory cell 140 is not in use, data is read from the memory cell 140 (S330). To read the data, a read voltage 145 is selected from voltage source 180 by switch 130 and applied to data line 135 via clamp 120 and switch 160. A voltage at node 170 is representative of the data in memory cell 140. The data read from memory cell 140 is used to determine the value used for Vref.

Next, a weak cell test is performed (S340) in the manner described above in section B2. If the memory cell 140 passes the weak cell test (S350), the process is repeated by selecting a next memory cell 140 in the array to test (S310). Alternatively, if the memory cell 140 fails the weak cell test, the data is rewritten to the memory cell 140 (S360) in the manner described above in section B1, and after rewriting the data, the process is repeated by selecting the next memory cell 140 in the array (S310).

C3. Foreground Memory Test

Figure 4:
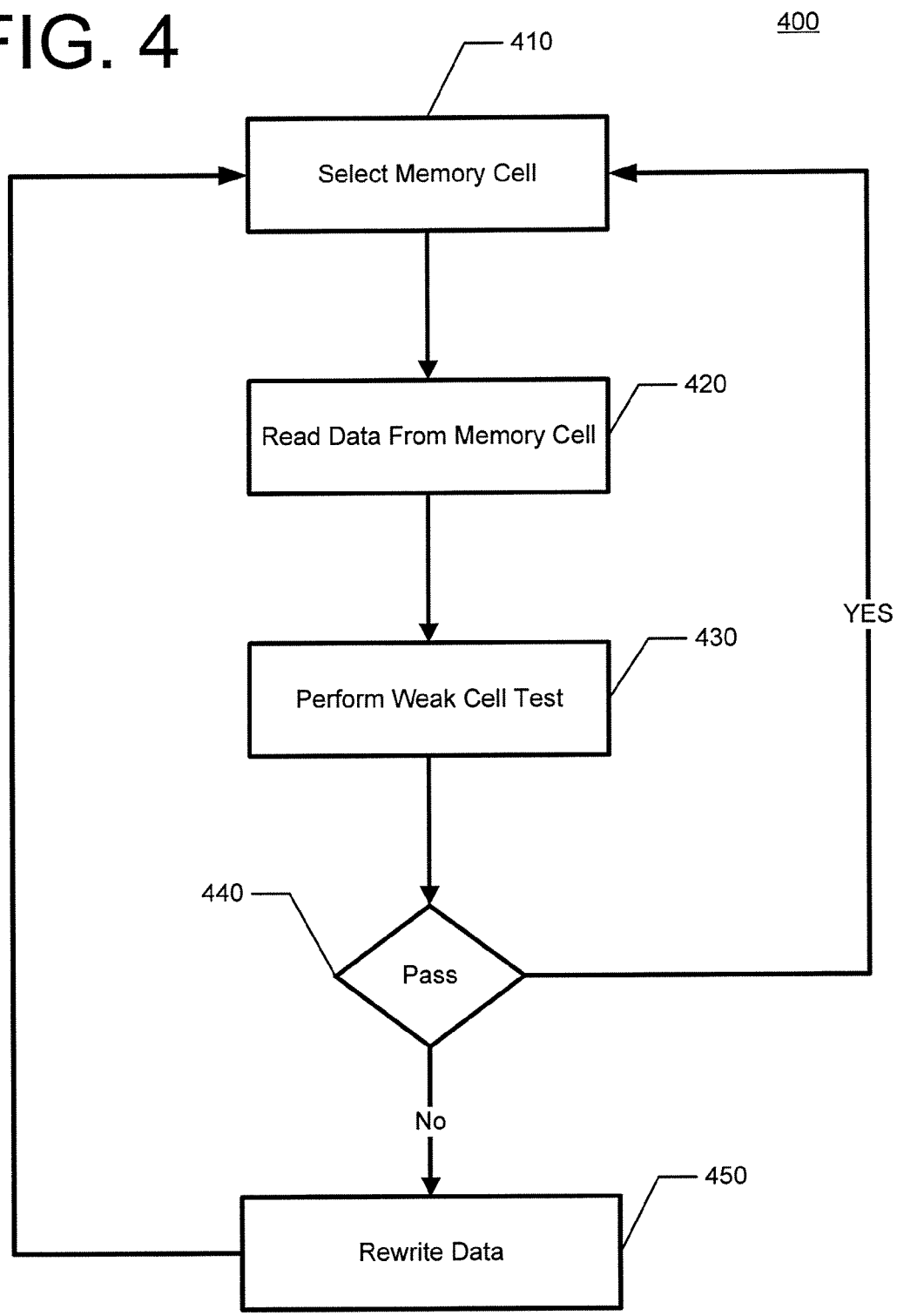
FIG. 4 is a flow chart showing a foreground memory test in accordance with an embodiment of the invention.

FIG. 4 depicts a foreground memory test 400 in accordance with an embodiment of the invention. A foreground memory test is a test in which a weak cell test to verify memory cell content is performed with a memory cell is read.

The foreground memory test 400 begins by selecting a memory cell 140, which includes a phase change material (S410). Next, data is read from the memory cell 140 (S420). In an embodiment, the data is temporarily stored to another location. To read the data a read voltage 145 is selected from voltage source 180 by switch 130 and applied to data line 135 via clamp 120 and switch 160. A voltage at node 170 is representative of the data in memory cell 140. The data read from memory cell 140 is used to determine the value used for Vref. The system then performs a weak cell test (S430) as described above in section B2. If the cell passes the weak cell test (S440), the next memory cell 140 is selected for a read operation (S410). If the memory cell 140 fails the weak cell test, the data that was read is rewritten to the memory cell 140 (S450), as described above in section B1, and then the next memory cell 140 is selected (S410).

It should be noted that in operation, the system can switch between the operating modes. The system can switch between reading and writing to memory cells and verifying those cells. Additionally, it should be noted that in an embodiment, different cells in an array can be simultaneously read, written to, or verified. In an embodiment of the invention, after a cell fails the weak cell test, the repair step of rewriting the data may be scheduled to be performed at a later time or may be repeated several times if necessary to restore the contents of a weak cell.

PCMs function in all situations where a non-volatile memory is used including cell phones, SIM cards, data storage medium, ID cards, access control cards, charge cards, hotel access cards, passports, metro cards, and the like. In these environments, the PCM must operate in an approximately 85° C. environment. In other situations such as automobile alarms, a PCM is expected to function in 150° C. or higher environments. Automotive applications include alarms, fuel injection controls, and the like. In modern automobiles, portions of the electronics for the alarm are mounted in the oil pan. In this way, a thief is unable to access the control portion or memory portion of the alarm to disable it. However, the extreme conditions in the engine may deteriorate the PCM. Data loss at elevated temperatures is mostly attributed to gradual crystallization. Hence, the above-described approach may be used to filter those cells. Therefore, the weak cell test ensures that data is not lost in these extreme conditions.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A data retention monitor for a phase change memory cell comprising:
    a switch coupled to a voltage source adapted to provide a selectable voltage to a data line coupled to the phase change memory cell, the selectable voltage comprising a read voltage and a test voltage, the test voltage being greater than the read voltage; and
    a voltage comparator adapted to compare a phase change memory cell voltage with a reference voltage after the provision of the selectable voltage to the data line,
    wherein if the phase change memory cell voltage generated at least in part by the test voltage is substantially equal to the reference voltage, the phase change memory cell has retained its data, and otherwise has not retained its data.

2. The data retention monitor of claim 1, wherein the read voltage is within an approximate range of 50 mV to 800 mV.

3. The data retention monitor of claim 1, wherein the test voltage is within an approximate range of 50 mV to 1V greater than the read voltage.

4. The data retention monitor of claim 1, further comprising a feedback loop coupled between the phase change memory cell and the voltage source.

5. The data retention monitor of claim 4, wherein a voltage of the feedback loop is about 450 mV.

6. The data retention monitor of claim 1, wherein the data stored in the phase change memory cell is rewritten when the phase change memory cell voltage generated at least in part by the test voltage is not substantially equal to the reference voltage.

7. The data retention monitor of claim 1, further comprising a current source coupled to the phase change memory cell to provide at least one of at least two programming currents to the phase change memory cell.

8. The data retention monitor of claim 1, wherein the current source provides at least one of a first current, which is adapted to change a phase of the phase change memory cell to an at least partially amorphous state, and a second current, which is adapted to change the phase of the phase change memory cell to an at least partially crystalline state.

9. The data retention monitor of claim 1, wherein the voltage source is coupled to the phase change memory cell via a clamp.

10. A data retention monitor for a phase change memory cell comprising:
    a switching means coupled to a voltage source means for providing first and second voltages to a data line coupled to the phase change memory cell, the first voltage being greater than the second voltage; and
    voltage comparison means for comparing a reference voltage with a phase change memory cell voltage generated at least in part by the provision of the first voltage to the data line,
    wherein if the phase change memory cell voltage generated at least in part by the first voltage is substantially equal to the reference voltage, the phase change memory cell has retained its data, and otherwise has not retained its data.

* * * * *